(12) United States Patent  
Shuto (10) Patent No.: US 8,804,408 B2  
(45) Date of Patent: Aug. 12, 2014

(54) SEMICONDUCTOR STORAGE DEVICE (75) Inventor: Susumu Shuto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 346 days.

(21) Appl. No.: 13/231,799

(22) Filed: Sep. 13, 2011

(65) Prior Publication Data

US 2012/0243303 A1    Sep. 27, 2012

(30) Foreign Application Priority Data

Mar. 24, 2011  (JP) ................................ 2011-065723

(51) Int. Cl.  
*G11C 11/00* (2006.01)

(52) U.S. Cl.  
CPC ............ *G11C 11/00* (2013.01); *Y10S 977/935* (2013.01)  
USPC ............ 365/158; 365/148; 365/171; 977/935

(58) Field of Classification Search  
CPC .................................................... G11C 11/00  
USPC ......... 365/48, 55, 62, 66, 74, 78, 80–93, 100, 365/130, 131, 148, 158, 171–173, 209, 213, 365/225.5, 230.07, 232, 243.5; 216/22; 257/421, E21.665; 438/3; 428/810–816, 817–825.1, 826; 977/933–935  
See application file for complete search history.

(56) References Cited

U.S. PATENT DOCUMENTS

| | | | |
|---|---|---|---|
| 6,999,340 B2 * | 2/2006 | Shimizu | 365/158 |
| 7,221,585 B2 * | 5/2007 | Bessho | 365/173 |
| 7,286,394 B2 * | 10/2007 | Ooishi | 365/158 |
| 7,760,543 B2 * | 7/2010 | Ueda | 365/158 |
| 8,154,913 B2 * | 4/2012 | Fukami et al. | 365/158 |
| 8,331,136 B2 * | 12/2012 | Ohmori et al. | 365/158 |
| 8,503,222 B2 * | 8/2013 | Suzuki et al. | 365/158 |
| 2004/0218314 A1 * | 11/2004 | Gill | 360/324.2 |
| 2006/0098480 A1 * | 5/2006 | Bessho | 365/158 |
| 2007/0211523 A1 * | 9/2007 | Kim | 365/158 |
| 2009/0091969 A1 * | 4/2009 | Ueda | 365/148 |
| 2010/0254183 A1 * | 10/2010 | Fukami et al. | 365/158 |
| 2010/0328993 A1 * | 12/2010 | Ohmori et al. | 365/158 |
| 2011/0292718 A1 * | 12/2011 | Suzuki et al. | 365/158 |

FOREIGN PATENT DOCUMENTS

JP    2007-294010    11/2007

OTHER PUBLICATIONS

"A 64Mb MRAM with Clamped-Reference and Adequate-Reference Schemes," IEEE International Solid-State Circuit Conference, 2010.  
Hosomi et al., "A Novel Nonvolatile Memory with Spin Torque Transfer Magnetization Switching: Spin-RAM," IEEE, 2005.

* cited by examiner

*Primary Examiner* — Harry W Byrne  
(74) *Attorney, Agent, or Firm* — Knobbe Martens Olson & Bear LLP (57) ABSTRACT

A semiconductor storage device according to the present embodiment includes a magnetic tunnel junction element capable of storing data according to a change in resistance state and rewriting the data using a current. A cell transistor is provided for the magnetic tunnel junction element and is placed in a conducting state when a current is allowed to flow through the magnetic tunnel junction element. A current limiter limits a current flowing through the cell transistor and the magnetic tunnel junction element upon data writing.

19 Claims, 8 Drawing Sheets

SEMICONDUCTOR STORAGE DEVICE

CROSS REFERENCE TO RELATED APPLICATIONS

This application is based upon and claims the benefit of priority from the prior Japanese Patent Application No. 2011-065723, filed on Mar. 24, 2011, the entire contents of which are incorporated herein by reference.

FIELD

The embodiments of the present invention relate to a semiconductor memory device.

BACKGROUND

As one of resistance change type memories, there is a Magnetic Random Access Memory (MRAM). MRAM writing schemes include a magnetic field writing scheme and a spin injection writing scheme. Of those writing schemes, the spin injection writing scheme has a characteristic that the smaller the size of a magnetic material, the smaller the spin injection current required for magnetization reversal, and thus is advantageous in terms of achieving high integration, low power consumption, and high performance.

An MTJ (Magnetic Tunnel Junction) element of the spin injection writing scheme has a stacked structure including two ferromagnetic layers and a non-magnetic barrier layer (insulating thin film) sandwiched therebetween, and stores digital data according to a change in magnetic reluctance caused by spin-polarized tunneling effect. The MTJ element can take a low resistance state and a high resistance state according to the magnetization alignment of the two ferromagnetic layers. When the magnetization alignment of the two ferromagnetic layers are in a parallel state (P state), the MTJ element is placed in a low resistance state, and when the magnetization alignment of the two ferromagnetic layers are in an anti-parallel state (AP state), the MTJ element is placed in a high resistance state.

When a P state is written, there is a need to allow a current required to reverse the MTJ element from an AP state to a P state to flow. When an AP state is written, there is a need to allow a current required to reverse the MTJ element from a P state to an AP state to flow.

Normally, MTJ elements, cell transistors, etc., have resistance distribution (variation). Thus, even in the case of the highest sum total of the resistances of an MTJ element and a cell transistor and parasitic resistances, there is a need to allow a sufficient write current to flow through the MTJ element so that data writing can be securely performed.

However, if the MTJ element, the cell transistor, etc., are designed to thus allow a sufficient write current to flow, then when conversely the resistance of the MTJ element, the resistance of the cell transistor, parasitic resistances, etc., are lowest, a current is too large, which may break down a barrier layer of the MTJ element. In this case, an excessive current which flows through the barrier layer of the MTJ element and accordingly the barrier layer may break down. This leads to a problem of deterioration in the reliability of the MTJ element.

DETAILED DESCRIPTION

A semiconductor storage device according to the present embodiment includes a magnetic tunnel junction element capable of storing data according to a change in resistance state and rewriting the data using a current. A cell transistor is provided for the magnetic tunnel junction element and is placed in a conducting state when a current is allowed to flow through the magnetic tunnel junction element. A current limiter limits a current flowing through the cell transistor and the magnetic tunnel junction element upon data writing.

Embodiments will now be explained with reference to the accompanying drawings.

First Embodiment

Figure 1:
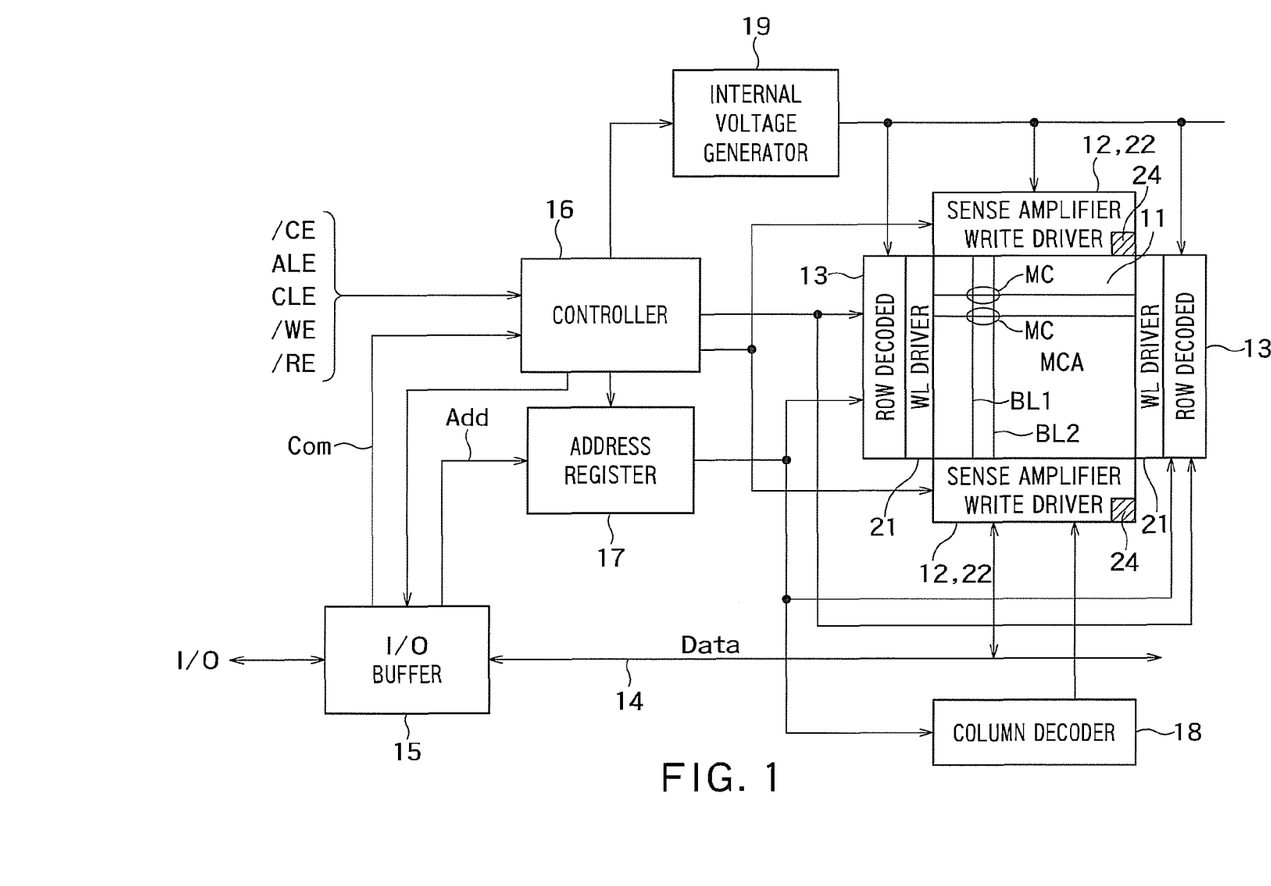
FIG. 1 is a block diagram showing a configuration of an MRAM according to a first embodiment.

FIG. 1 is a block diagram showing a configuration of an MRAM according to a first embodiment. In a memory cell array 11, a plurality of memory cells MCs are arranged two-dimensionally in a matrix form. Each memory cell MC includes an MTJ element and a cell transistor. The MTJ element is a magnetic tunnel junction element capable of storing data according to a change in resistance state and rewriting the data using a current. The cell transistor is provided for the MTJ element and is configured to go into a conducting state when a current is allowed to flow through the MTJ element.

A plurality of word lines WLs and a plurality of bit lines BLs are wired in a row direction and a column direction, respectively, so as to intersect each other. Two adjacent bit lines BLs make a pair and each memory cell MC is provided at an intersection of a word line WL and a pair of bit lines (e.g., a first bit line BL1 and a second bit line BL2). An MTJ element and a cell transistor of each memory cell MC are connected in series with each other between a pair of bit lines (e.g., between BL1 and BL2). In addition, a gate of the cell transistor is connected to a corresponding word line WL.

Sense amplifiers 12 and write drivers 22 are disposed on both sides in a bit line direction of the memory cell array 11. The sense amplifiers 12 are connected to the bit lines BLs, and detect a current flowing through a memory cell MC connected to a selected word line WL and thereby read data stored in the memory cell MC. The write drivers 22 are connected to the bit lines BLs, and write data by allowing a current to flow through a memory cell MC connected to a selected word line WL.

Row decoders 13 and word line drivers 21 are disposed on both sides in a word line direction of the memory cell array 11. The word line drivers 21 are connected to the word lines WLs, and are configured to apply a voltage to a selected word line WL upon data reading or data writing.

Exchange of data between the sense amplifiers 12 or the write drivers 22 and an external input/output terminal I/O is performed via a data bus 14 and an I/O buffer 15.

To a controller 16 are inputted various external control signals, e.g., a chip enable signal /CE, an address latch enable signal ALE, a command latch enable signal CLE, a write enable signal /WE, and a read enable signal /RE. The controller 16 identifies an address Add and a command Com which are supplied from the input/output terminal I/O, based on the control signals. Then, the controller 16 transfers the address Add to the row decoders 13 and a column decoder 18 through an address register 17. In addition, the controller 16 decodes the command Com. The sense amplifiers 12 are configured to be able to apply a voltage to a bit line according to a column address decoded by the column decoder 18. The word line drivers 21 are configured to be able to apply a voltage to a selected word line WL according to a row address decoded by the row decoders 13.

The controller 16 performs sequence control of data reading, data writing, and data erasing, according to external control signals and commands. An internal voltage generator 19 is provided to generate an internal voltage required for each operation (e.g., a voltage boosted by a power supply voltage). The internal voltage generator 19 is also controlled by the controller 16 and generates a required voltage by performing a boost operation.

Each write driver 22 includes a current limiter 24 serving as a current limiter. The current limiters 24 are configured to limit a current flowing through a cell transistor and an MTJ element upon data writing. Each current limiter 24 is composed of, for example, a current mirror circuit such as those shown in FIGS. 5A to 6.

Figure 2:
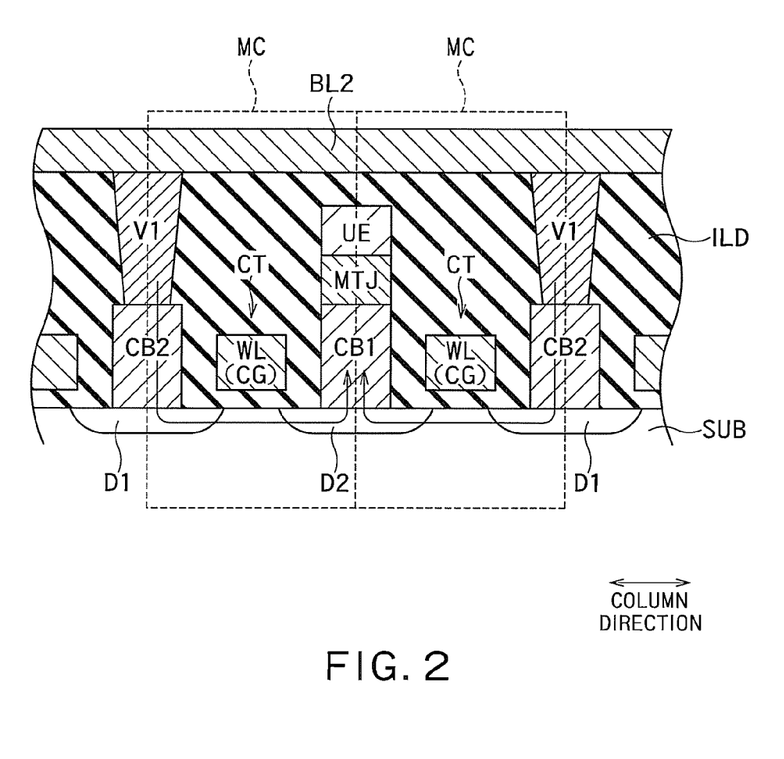
FIG. 2 is a cross-sectional view showing a configuration of a memory cell MC.

FIG. 2 is a cross-sectional view showing a configuration of a memory cell MC. A cell transistor CT is formed on a semiconductor substrate SUB. A first diffusion layer D1 of the cell transistor CT is connected to a bit line BL2 through a contact plug CB2 and a via contact V1. A second diffusion layer D2 of the cell transistor CT is connected to a lower end (lower electrode) of an MTJ element through a contact plug CB1.

An upper electrode UE is provided on the MTJ element. The upper electrode UE extends in a direction perpendicular to the paper in FIG. 2 (a row direction), and is connected to upper ends of two MTJ elements adjacent to each other in the row direction. The upper electrode UE connects the upper ends of the two MTJ elements to a bit line BL1 (not shown in FIG. 2) in a shared manner. Note that the bit line BL1 is a bit line adjacent in the row direction to the bit line BL2. Therefore, the bit line BL1 is not shown in FIG. 2.

A word line WL functions as both a word line and a gate electrode CG of a cell transistor CT. However, it is also possible that a gate electrode CG of a cell transistor CT is separately provided and a word line WL is formed to be electrically connected to the gate electrode CG in a layer different from that for the gate electrode CG.

The bit line BL2 is electrically connected to the lower end of the MTJ element through the via contact V1, the contact plug CB2, the cell transistor CT, and the contact plug CB1. The bit line BL1 is electrically connected to the upper end of the MTJ element through the upper electrode UE. Namely, the MTJ element and the cell transistor CT are connected in series with each other between the bit line BL1 and the bit line BL2.

Figure 3:
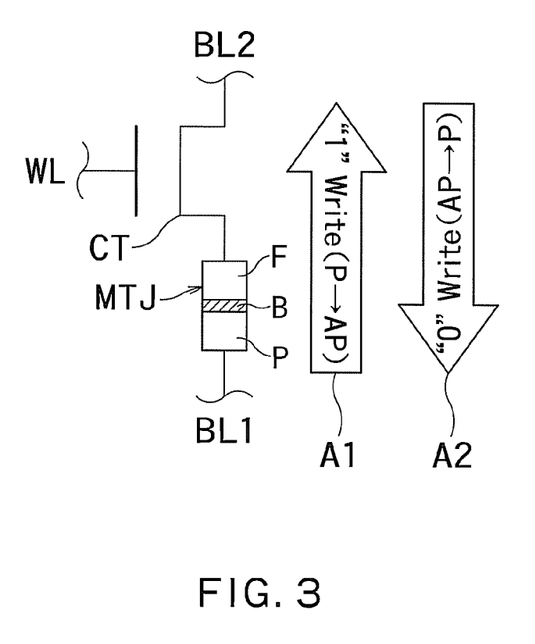
FIG. 3 is an illustrative diagram showing a write operation of a memory cell MC.

FIG. 3 is an illustrative diagram showing a write operation of a memory cell MC. An MTJ element utilizing tunneling magnetoresistive (TMR) effect has a stacked structure including two ferromagnetic layers F and P and a non-magnetic layer (insulating thin film) B sandwiched therebetween, and stores digital data according to a change in magnetic reluctance caused by spin-polarized tunneling effect. The MTJ element can take a low resistance state and a high resistance state according to the magnetization alignment of the two ferromagnetic layers F and P. For example, when the low resistance state is defined as data "0" and the high resistance state is defined as data "1", 1-bit data can be recorded in the MTJ element. Of course, the low resistance state may be defined as data "1" and the high resistance state may be defined as data "0".

For example, the MTJ element is configured such that a fixed layer (Pin layer) P, a tunnel barrier layer B, and a recording layer (Free layer) F are sequentially stacked on top of one another. The Pin layer P and the Free layer F are composed of ferromagnets and the tunnel barrier layer B is composed of an insulating film (e.g., $Al_2O_3$ or MgO). The Pin layer P is a layer having a fixed magnetization direction and the Free layer F has a variable magnetization direction and stores data according to the magnetization direction.

When an electric field is applied in a direction of an arrow A1 upon writing, the magnetization direction of the Free layer F is placed in an anti-parallel state (AP state) with respect to the magnetization direction of the Pin layer P, resulting in a high resistance state (data "1"). When an electric field is applied in a direction of an arrow A2 upon writing, the magnetization directions of the Pin layer P and the Free layer F are placed in a parallel state (P state), resulting in a low resistance state (data "0"). As described above, the MTJ element can write different data units according to different electric field application directions.

Figure 4:
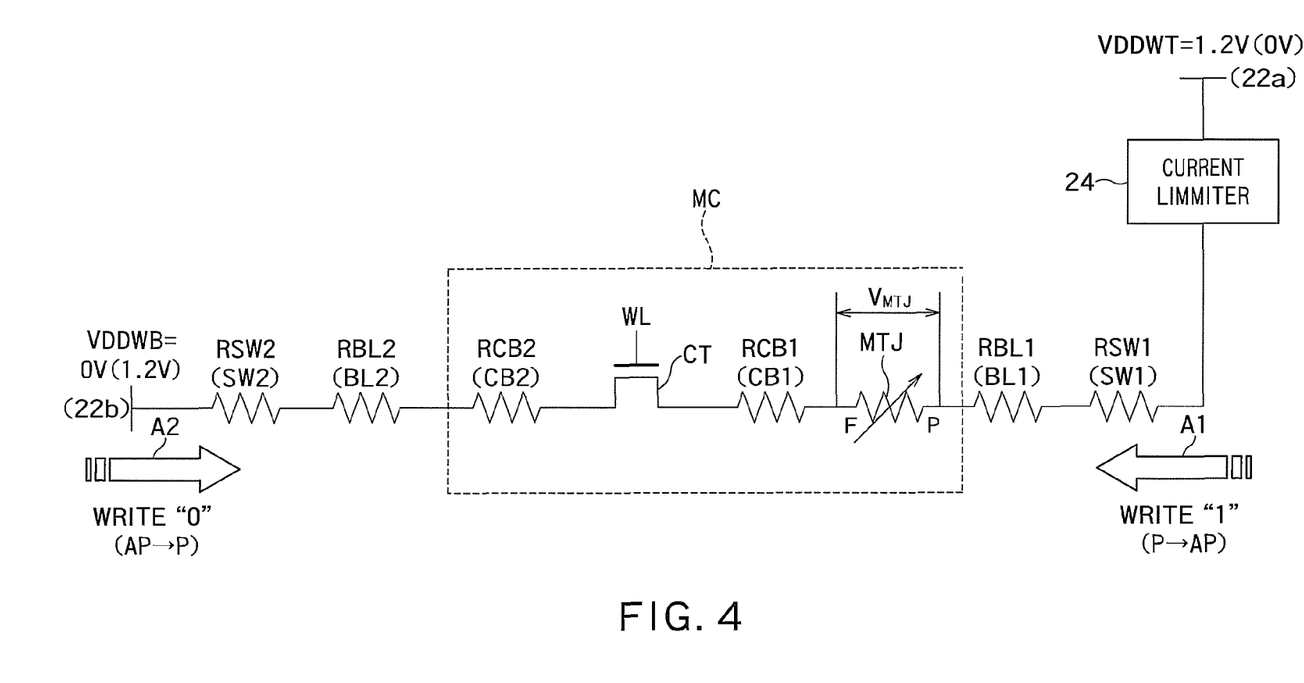
FIG. 4 is an equivalent circuit diagram of a selected memory cell MC and a current path connected thereto for a data write operation.

FIG. 4 is an equivalent circuit diagram of a selected memory cell MC and a current path connected thereto for a data write operation. A selected memory cell MC is connected between write drivers 22a and 22b provided on both sides of a memory cell array MCA. The write driver 22a is connected to one end of the selected memory cell MC through a bit line BL1, and the write driver 22b is connected to the other end of the selected memory cell MC through a bit line BL2. The bit lines BL1 and BL2 are connected to the write drivers 22a and 22b through switches SW1 and SW2, respectively. A cell transistor CT is connected to an MTJ element through a contact CB1 and is connected to the bit line BL2 through a contact CB2. Furthermore, a current limiter 24 is provided between the write driver 22a and the bit line BL1. As described above, the current limiter 24, the switch SW1, the bit line BL1, the MTJ element, the contact CB1, the cell transistor CT, the contact CB2, the bit line BL2, and the switch SW2 are connected in series between the write drivers 22a and 22b.

Note that although in FIG. 4 the switches SW1 and SW2 are shown as resistors, in practice, the switches SW1 and SW2 are composed of switching elements such as Field Effect Transistors (FETs). Upon data writing, in order to connect the bit lines BL1 and BL2 connected to the selected memory cell MC to the write drivers 22a and 22b, respectively, the switches SW1 and SW2 are placed in a conducting state. In addition, the cell transistor CT of the selected memory cell MC is also placed in a conducting state by driving of a word line WL. Therefore, in FIG. 4, the switches SW1 and SW2 and the cell transistor CT are shown as resistors.

The resistance values of the switches SW1 and SW2, the bit lines BL1 and BL2, the contacts CB1 and CB2, the cell transistor CT, and the MTJ element are RSW1, RSW2, RBL1, RBL2, RCB1, RCB2, RCT, and RMTJ, respectively. In addition, there are parasitic resistances (e.g., the resistance of a via V1 and the resistance of an upper electrode UE) but since those parasitic resistances are very small, they are omitted here.

In FIG. 4, a Free layer F of the MTJ element is connected to the side of the cell transistor CT, and a Pin layer P is connected to the power supply side (the side of the write driver 22a). The connection relationship between the MTJ element and the cell transistor CT shown in FIG. 4 is the same as that shown in FIG. 3.

When a current flows through the selected memory cell MC from the write driver 22a via the current limiter 24, an AP state (data "1") is written to the MTJ element. At this time, a power supply voltage VDDWT on the side of the write driver 22a is, for example, 1.2 V and a power supply voltage VDDWB on the side of the write driver 22b is, for example, 0 V.

When the MTJ element is in a P state (low resistance state) and the sum of the resistance RCT of the cell transistor CT and other parasitic resistances (RCT+RSW1+RSW2+RBL1+RBL2+RCB1+RCB2) varies to the lower side, the overall resistance value between the write drivers 22a and 22b is small. Therefore, the write current is large.

Furthermore, when an AP state is written as indicated by A1 in FIGS. 3 and 4, the MTJ element is on the drain side of the cell transistor CT or on the high voltage side of the cell transistor CT. In this case, since a source voltage of the cell transistor CT is not increased, the voltage difference between the gate and source of the cell transistor CT is maintained to be large. Hence, the resistance RCT of the cell transistor CT is relatively low. Therefore, as shown in FIG. 4, when the Free layer F is connected to the side of the cell transistor CT and the Pin layer P is connected to the power supply side (high voltage source side), an excessive current may flow through the MTJ element upon writing of an AP state.

Hence, the current limiter 24 limits the current flowing through the MTJ element from the power supply VDDWT when the MTJ element is on the drain side of the cell transistor CT or on the high voltage side of the cell transistor CT. In this case, the current limiter 24, the MTJ element, and the cell transistor CT are connected in the order of the current limiter 24, the MTJ element, and the cell transistor CT from the power supply VDDWT. Namely, the current limiter 24 is connected on the opposite side of the MTJ element from the cell transistor CT. The current limiter 24 is configured to have an upper limit of a current and to suppress, when a current larger than the upper limit flows from the power supply VDDWT, the current to the upper limit.

On the other hand, when a P state (data "0") is written as indicated by A2 in FIGS. 3 and 4, a current is allowed to flow through the selected memory cell MC from the write driver 22b via the cell transistor CT. At this time, the power supply voltage VDDWB on the side of the write driver 22b is, for example, 1.2 V and the power supply voltage VDDWT on the side of the write driver 22a is, for example, 0 V.

When a P state (data "0") is written, the MTJ element is connected to the source side of the cell transistor CT. In this case, the source voltage of the cell transistor CT increases by an amount corresponding to a voltage VMTJ applied to the MTJ element. Hence, the voltage difference between the gate and source of the cell transistor CT is small and the resistance RCT of the cell transistor CT is higher than that for writing of an AP state. Therefore, as shown in FIG. 4, when the Free layer F is connected to the side of the cell transistor CT and the Pin layer P is connected to the power supply side, a current flowing through the MTJ element upon writing of a P state is smaller than a current flowing through the MTJ element upon writing of an AP state. Therefore, in this case, the current limiter 24 does not limit the current flowing through the MTJ element.

Note that the parasitic resistances RSW1, RSW2, RCB1, RCB2, etc., are very smaller than the resistance RMTJ of the MTJ element. Hence, the conducting state (resistance value) of the cell transistor CT changes relatively greatly depending on which side, the drain side or source side of the cell transistor CT, the MTJ element is located on.

From the above, it is preferable that the current limiter 24 be connected to the drain side of the cell transistor CT or to the high voltage side of the MTJ element when the MTJ element is in a P state (low resistance state) and an AP state is written.

For example, FIGS. 5A and 5B are circuit diagrams of current mirror circuits which are specific examples of the current limiter 24. The current limiter 24 can be composed of a current mirror circuit shown in either FIG. 5A or 5B. In this case, the current limiter 24 needs to be connected to the drain side of the cell transistor CT or to the more upstream side (high voltage side) than the MTJ element. This is because the current mirror circuit is configured to adjust a voltage applied to a gate of a transistor connected to the target side in order to allow a current having the same magnitude as a current flowing through a reference circuit to flow through a target circuit. Namely, this is because the current mirror circuit controls the current of the target circuit by a voltage. Note that the target circuit corresponds to a circuit shown in FIG. 3 to which a selected memory cell MC is connected.

A current mirror circuit shown in FIG. 5A includes P-type transistors P1 and P2 and a resistor R1. The transistor P1 and the resistor R1 are connected in series with each other between a power supply Vdd and a ground GND. The transistor P2 is connected between a power supply Vdd and a target circuit Ctrg. The gates of the transistors P1 and P2 are connected in a shared manner and are connected to a connection node N1 between the transistor P1 and the resistor R1. Therefore, assuming that the transistors P1 and P2 have the same current drive capability, a current having the same magnitude as a current flowing through the reference circuit Cref flows through the target circuit Ctrg. The conducting states (resistance values) of the transistors P1 and P2 depend on the voltage at the node N1. Therefore, by adjusting the resistance value of the resistor R1 to a predetermined value, the currents flowing through the reference circuit Cref and the target circuit Ctrg can be adjusted. The resistance value of the resistor R1 is set based on measured values or statistics in an MRAM testing process.

A current mirror circuit shown in FIG. 5B is a low voltage cascode current mirror circuit. This current mirror circuit includes P-type transistors P10 to P50 and resistors R10 and R20. The transistors P20 and P40 are connected in series with each other between a power supply Vdd and a target circuit Ctrg. The transistors P10 and P30 are connected in series with each other between a power supply Vdd and a reference circuit Cref1. The transistor P50 is connected between a power supply Vdd and a reference circuit Cref2. The low voltage cascode current mirror circuit can favorably control a current even if the characteristics of the transistors P10 to P50, etc., vary from one another.

The gates of the transistors P10 and P20 are connected to the target circuit Ctrg (the source of the transistor P40) in a shared manner. The gates of the transistors P30 to P50 are connected to a node N2 of the reference circuit Cref2 (the source of the transistor P50) in a shared manner. The node N2 is a connection node between the transistor P50 and the resistor R20.

Assuming that the transistors P30, P40, and P50 have the same current drive capability, a current having the same magnitude as a current flowing through the reference circuit Cref2 flows through the reference circuit Cref1 and the target circuit Ctrg. Assuming that the transistors P10 and P20 have the same current drive capability, a current having the same magnitude as a current flowing through the target circuit Ctrg flows through the reference circuit Cref1. As a result, a current substantially equal to a current flowing through the reference circuit Cref2 flows through the target circuit Ctrg.

The conducting states (resistance values) of the transistors P30, P40, and P50 depend on the voltage at the node N2. Therefore, by adjusting the resistance value of the resistor R20 to a predetermined value, the currents flowing through the reference circuits Cref1 and Cref2 and the target circuit Ctrg can be adjusted. The resistance value of the resistor R20 is set based on measured values or statistics in an MRAM testing process.

Figure 6:
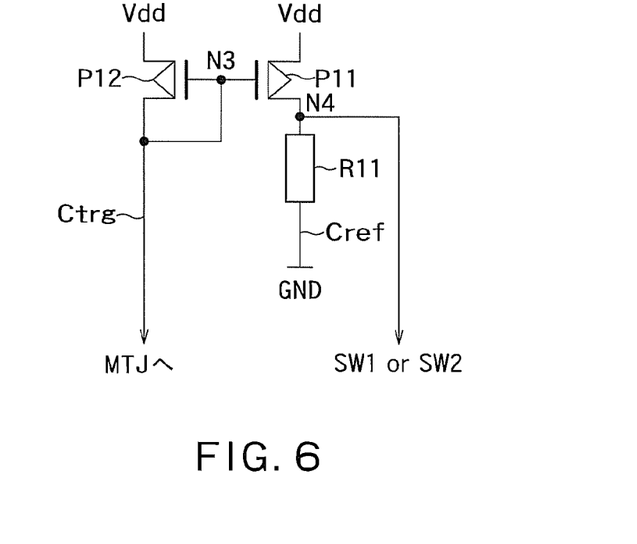
FIG. 6 is a circuit diagram of a current mirror circuit which is another specific example of the current limiter 24.

FIG. 6 is a circuit diagram of a current mirror circuit which is another specific example of the current limiter 24. The current mirror circuit includes P-type transistors P11 and P12 and a resistor R11. The transistor P12 is connected between a power supply Vdd and a target circuit Ctrg. The transistor P11 and the resistor R11 are connected in series with each other between a power supply Vdd and a reference circuit Cref.

The gates of the transistors P11 and P12 (node N3) are connected to the target circuit Ctrg (the source of the transistor P12) in a shared manner. A node N4 between the transistor P11 and the resistor R11 is connected to the gate of a switching element SW1 or SW2.

By this, equal currents flow through the reference circuit Cref and the target circuit Ctrg. By the voltage at the node N4, the conducting state of the switching element SW1 or SW2 is controlled. Namely, the current mirror circuit shown in FIG. 6 is configured to monitor, at the node N4, a current flowing through the target circuit Ctrg and control the conducting state (resistance value) of the switching element SW1 or SW2 based on a voltage at the node N4. Note that the voltage at the node N4 is a voltage applied to both ends of the resistor R11.

By adjusting the resistance value of the resistor R11 to a predetermined value, the conducting state (resistance value) of the switching element SW1 or SW2 can be controlled. The resistance value of the resistor R11 is set based on measured values or statistics in an MRAM testing process. By this, the currents flowing through the reference circuit Cref and the target circuit Ctrg can be adjusted. Such a current mirror circuit shown in FIG. 6 may be used as the current limiter 24.

Figure 5:
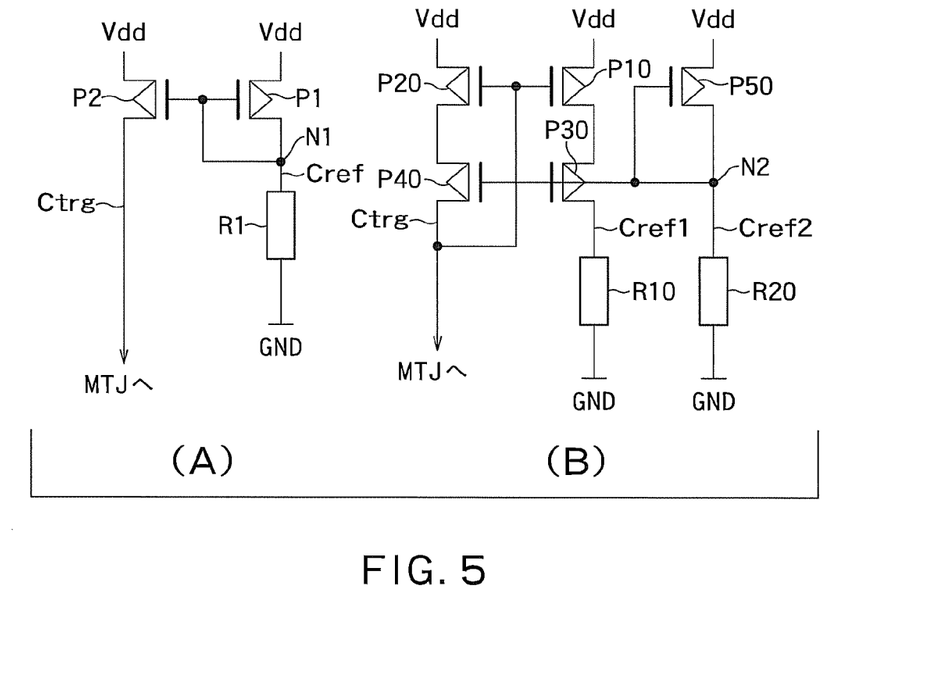
FIGS. 5A and 5B are circuit diagrams of current mirror circuits which are specific examples of the current limiter 24.

In the current mirror circuits shown in FIGS. 5A to 6, when a current is small, the current is allowed to flow as it is, but when a current exceeds a predetermined upper limit, the current is maintained to be substantially constant. Namely, the current mirror circuits function such that even if attempting to increase a current, the current mirror circuits prevent a current larger than or equal to the upper limit from flowing.

From the above, it can be seen that a large current flows through the MTJ element when: 1. the MTJ element is in a P state (low resistance state); 2. the sum of the resistance RCT of the cell transistor CT and other parasitic resistances varies to the lower side; and 3. the MTJ element is connected to the drain side of the cell transistor CT. When the above-described conditions 1 and 3 are applied to the present embodiment, a large current is likely to flow when an AP state (data "1") is written to the MTJ element being in a P state. This indicates that, when an AP state is written to the MTJ element being in a P state in the first place, a large current is likely to flow during a period during which the MTJ element is reversed from the P state to the AP state.

On the other hand, according to the present embodiment, the current limiter 24 is interposed between the MTJ element and the high voltage power supply VDDWT to limit the current flowing through the MTJ element. By this, the MRAM according to the present embodiment suppresses an excessive current from flowing through the MTJ element, enabling to suppress time dependent dielectric breakdown (TDDB), etc. This leads to an improvement in reliability.

Note that in general, in the MTJ element, writing from a P state to an AP state requires a larger current than writing from an AP state to a P state. The upper limit of a current allowed to flow by the current limiter 24 is determined based on a current required for the writing from a P state to an AP state. For example, when writing from a P state to an AP state requires a current of about 100 μA, the upper limit of a current allowed to flow by the current limiter 24 is set to 100 μA. The upper limit is experimentally or statistically determined. For example, a highest current value at which TDDB breakdown has not occurred even after 10 years of use may be set as the upper limit. By this, in the present embodiment, while maintaining the reliability of the MTJ element, writing from a P state to an AP state is performed without any problem.

Second Embodiment

Figure 7:
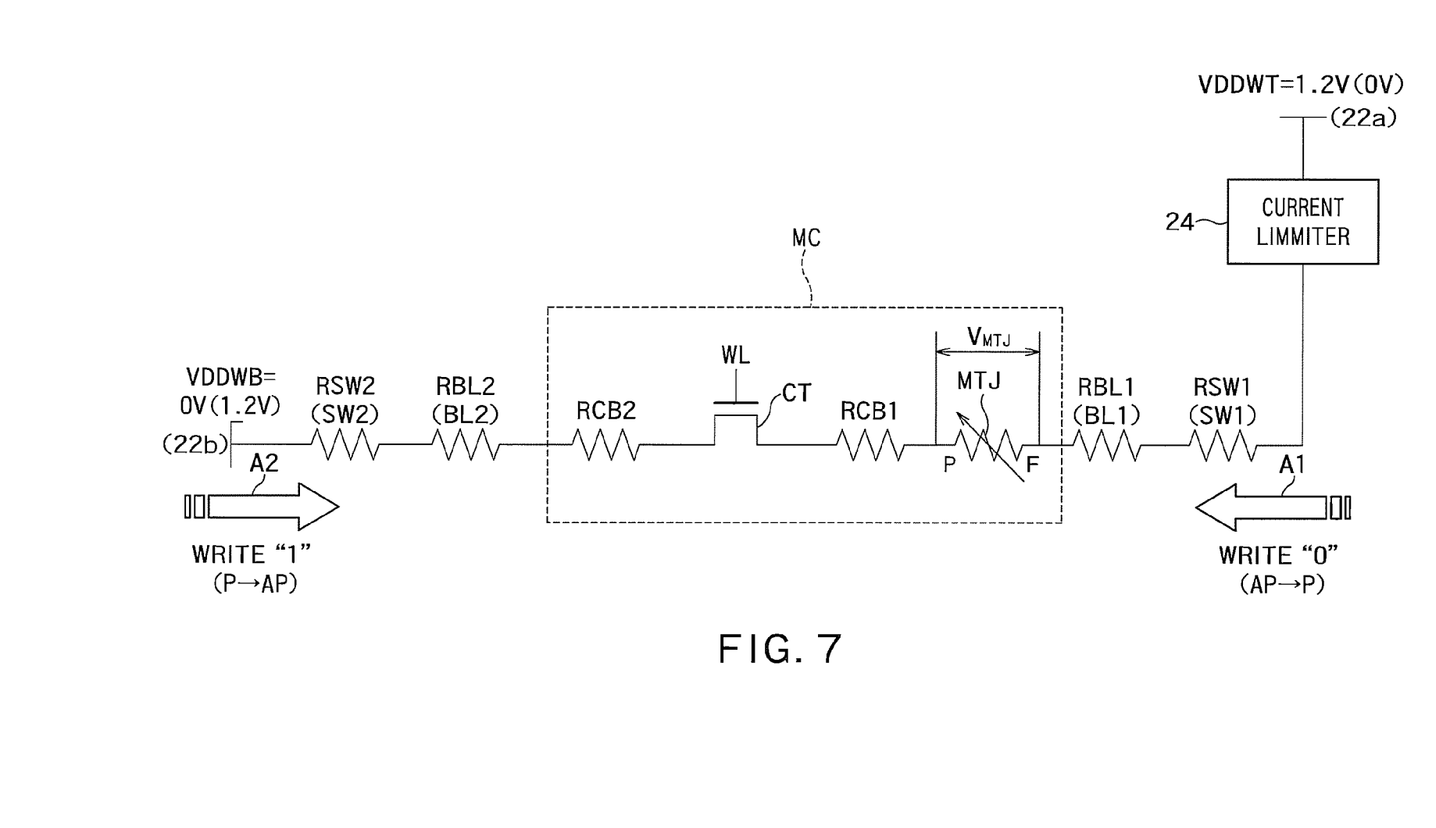
FIG. 7 is an equivalent circuit diagram of a selected memory cell MC and a current path connected thereto for a data write operation of an MRAM according to a second embodiment.

FIG. 7 is an equivalent circuit diagram of a selected memory cell MC and a current path connected thereto for a data write operation of an MRAM according to a second embodiment. In the second embodiment, the direction of connection of an MTJ element is opposite to that of an MTJ element in the first embodiment. Specifically, in the second embodiment, a Pin layer P is connected to the side of a cell transistor CT and a Free layer F is connected to the power supply side (the side of a write driver 22a). Other configurations in the second embodiment may be the same as corresponding ones in the first embodiment.

In the second embodiment, when a current flows through a selected memory cell MC from the write driver 22a via a current limiter 24 (arrow A1), a P state (data "0") is written to the MTJ element. At this time, a power supply voltage VDDWT on the side of the write driver 22a is, for example, 1.2 V and a power supply voltage VDDWB on the side of a write driver 22b is, for example, 0 V. By this, the MTJ element is connected to the drain side of the cell transistor CT.

On the other hand, when a current flows through the selected memory cell MC from the write driver 22b via the cell transistor CT (arrow A2), an AP state (data "1") is written to the MTJ element. At this time, the power supply voltage VDDWT on the side of the write driver 22a is, for example, 0 V and the power supply voltage VDDWB on the side of the write driver 22b is, for example, 1.2 V. By this, the MTJ element is connected to the source side of the cell transistor CT.

As described in the first embodiment, a large current is likely to flow through the MTJ element when the MTJ element is connected to the drain side of the cell transistor CT. Therefore, when a P state (data "0") is written to the MTJ element (when a current flows in the direction of the arrow A1), the current limiter 24 is provided on the drain side of the cell transistor CT or on the more upstream side (high voltage side) than the MTJ element. In this case, too, the current limiter 24, the MTJ element, and the cell transistor CT are connected in this order from the power supply VDDWT. Namely, the current limiter 24 is connected on the opposite side of the MTJ element from the cell transistor CT.

When the aforementioned conditions 1 and 3 are applied to the present embodiment, a large current is likely to flow when a P state (data "0") is written to the MTJ element being in a P state. This indicates that, when a P-state write operation is performed on the MTJ element being in a P state in the first place, a large current is likely to flow. Furthermore, this also indicates that, when a P state is written to the MTJ element being in an AP state in the first place, a large current is likely to flow after reversal of MTJ element from the AP state to the P state.

On the other hand, according to the present embodiment, the current limiter 24 is interposed between the MTJ element and the high voltage power supply VDDWT to limit the current flowing through the MTJ element. By this, the MRAM according to the present embodiment suppresses an excessive current from flowing through the MTJ element, enabling to improve reliability.

Note that, as described above, in the MTJ element, writing from an AP state to a P state is done with a smaller current than that required for writing from a P state to an AP state. The upper limit of a current allowed to flow by the current limiter 24 is determined based on a current required for the writing from an AP state to a P state. For example, when writing from an AP state to a P state requires a current of about 50 µA, the upper limit of a current allowed to flow by the current limiter 24 is set to 50 µA. The upper limit is experimentally or statistically determined. For example, a highest current value at which TDDB breakdown has not occurred even after 10 years of use may be set as the upper limit. By this, in the present embodiment, while maintaining the reliability of the MTJ element, writing from an AP state to a P state is performed without any problem.

Third Embodiment

Figure 8:
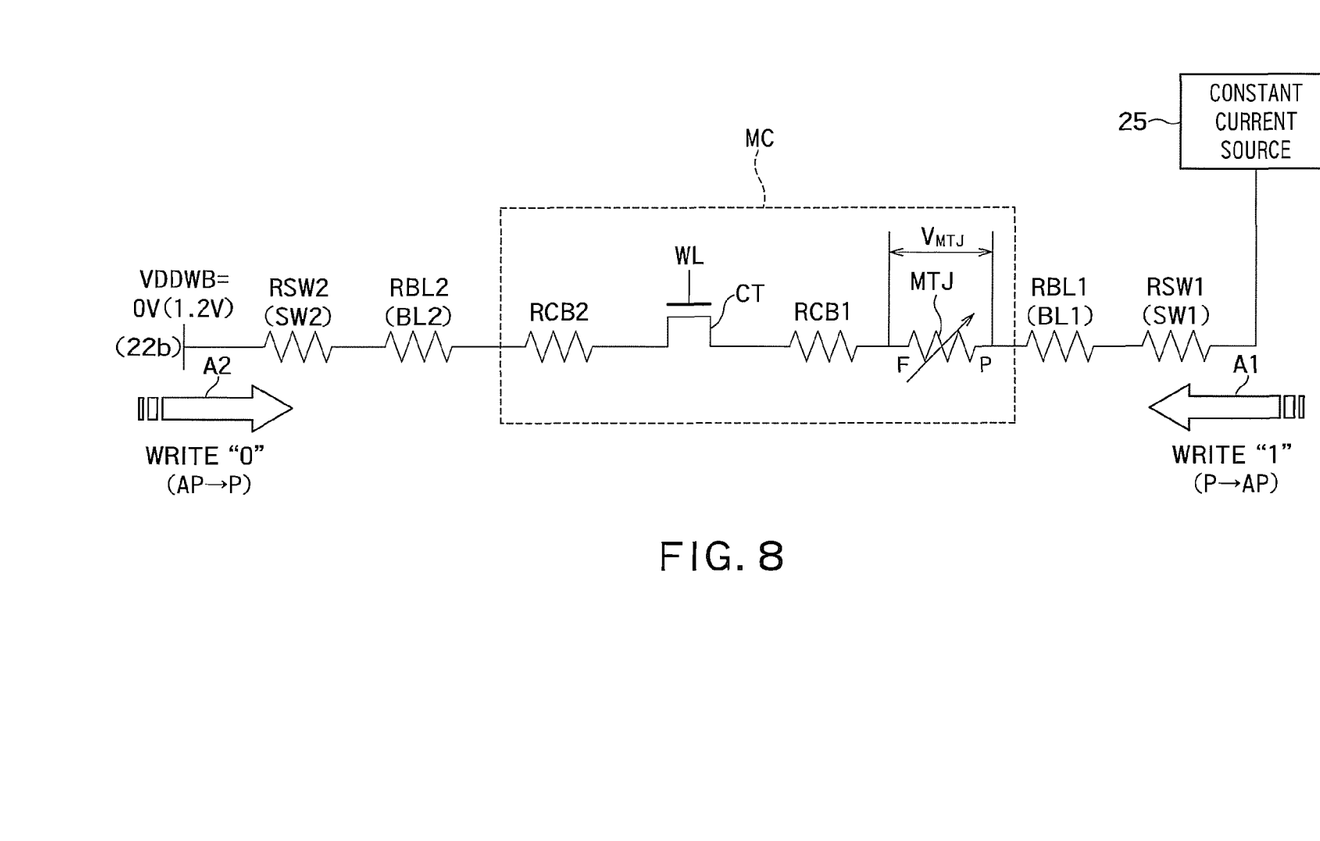
FIG. 8 is an equivalent circuit diagram of a selected memory cell MC and a current path connected thereto for a data write operation of an MRAM according to a third embodiment.

FIG. 8 is an equivalent circuit diagram of a selected memory cell MC and a current path connected thereto for a data write operation of an MRAM according to a third embodiment. In the third embodiment, a constant-current source 25 is provided instead of a power supply VDDWT and a current limiter 24. Other configurations in the third embodiment may be the same as corresponding ones in the first embodiment. The constant-current source 25 is configured to allow a current required to reverse an MTJ element from a P state to an AP state to flow. For example, the constant-current source 25 is configured to allow an upper-limit current in the first embodiment to flow.

As described above, the third embodiment using the constant-current source 25 can also limit a current flowing in a direction of an arrow A1 upon writing of an AP state. Thus, the third embodiment can obtain the same effects as those obtained in the first embodiment.

Fourth Embodiment

Figure 9:
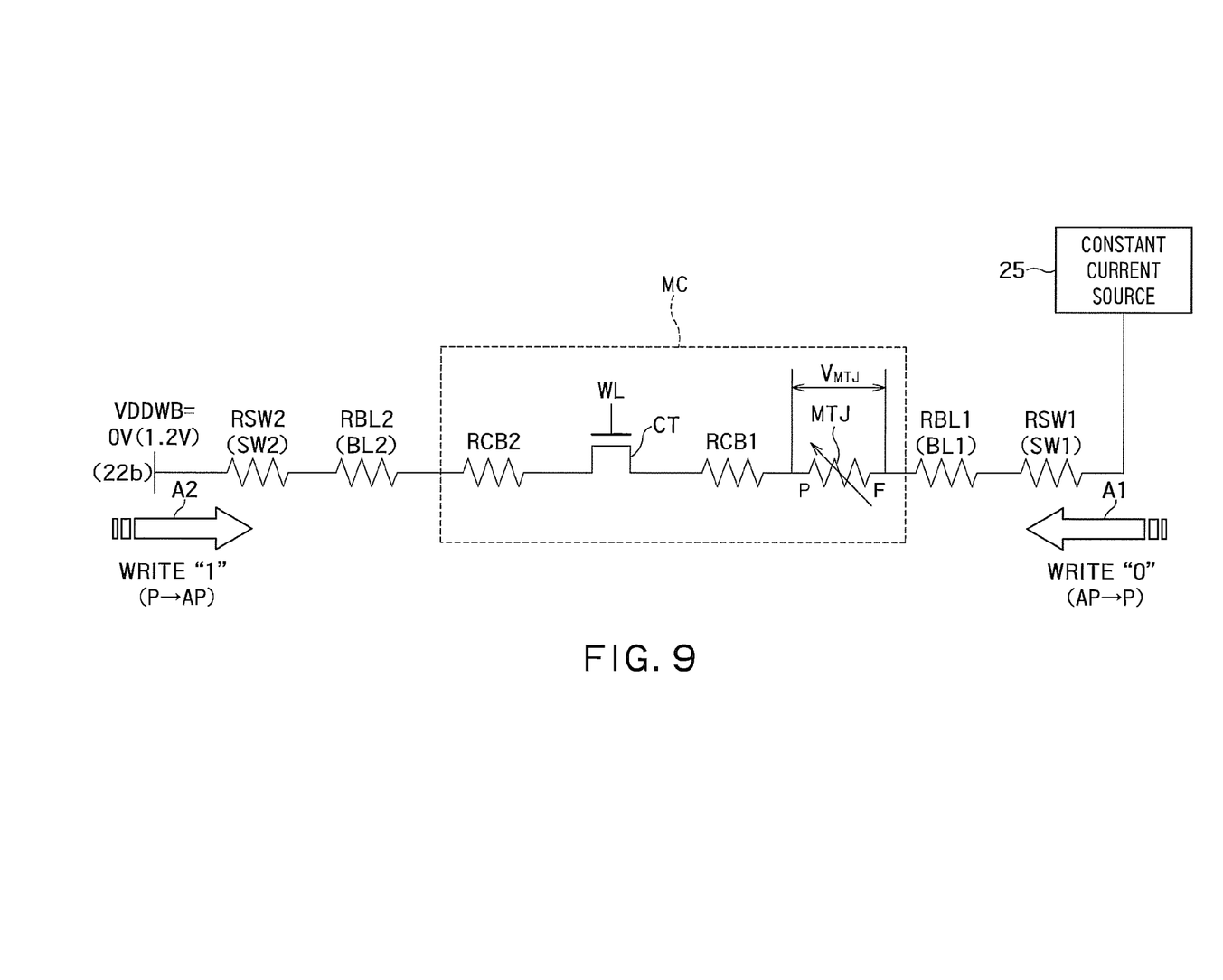
FIG. 9 is an equivalent circuit diagram of a selected memory cell MC and a current path connected thereto for a data write operation of an MRAM according to a fourth embodiment.

FIG. 9 is an equivalent circuit diagram of a selected memory cell MC and a current path connected thereto for a data write operation of an MRAM according to a fourth embodiment. In the fourth embodiment, a constant-current source 25 is provided instead of a power supply VDDWT and a current limiter 24. Other configurations in the fourth embodiment may be the same as corresponding ones in the second embodiment. The constant-current source 25 is configured to allow a current required to reverse an MTJ element from an AP state to a P state to flow. For example, the constant-current source 25 is configured to allow an upper-limit current in the second embodiment to flow.

As described above, the fourth embodiment using the constant-current source 25 can also limit a current flowing in a direction of an arrow A1 upon writing of a P state. Thus, the fourth embodiment can obtain the same effects as those obtained in the second embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a magnetic tunnel junction element configured to store data based on a change in resistance state and to rewrite the data using a current;
a cell transistor configured to enter a conducting state when a current flows through the magnetic tunnel junction element; and
a current limiter configured to limit a current flowing through the cell transistor and the magnetic tunnel junction element upon data rewriting.

2. The device according to claim 1, further comprising:
a first bit line; and
a second bit line, wherein
the magnetic tunnel junction element and the cell transistor are connected in series with each other between the first bit line and the second bit line, and
the current limiter is connected between the first bit line and a power supply.

3. The device according to claim 1, wherein the current limiter is connected on an opposite side of the magnetic tunnel junction element from the cell transistor.

4. The device according to claim 2, wherein the current limiter is connected on an opposite side of the magnetic tunnel junction element from the cell transistor.

5. The device according to claim 1, wherein the current limiter, the magnetic tunnel junction element, and the cell transistor are respectively connected in series to a power supply, the power supply configured to supply a current flowing through the magnetic tunnel junction element upon data rewriting.

6. The device according to claim 2, wherein the current limiter, the magnetic tunnel junction element, and the cell transistor are respectively connected in series to a power supply, the power supply configured to supply a current flowing through the magnetic tunnel junction element upon data rewriting.

7. The device according to claim 3, wherein the current limiter, the magnetic tunnel junction element, and the cell transistor are respectively connected in series to a power supply, the power supply configured to supply a current flowing through the magnetic tunnel junction element upon data rewriting.

8. The device according to claim 1, wherein
the magnetic tunnel junction element has a high resistance state and a low resistance state, and the current limiter is configured to limit a current flowing through the magnetic tunnel junction element when the magnetic tunnel junction element is in the low resistance state.

9. The device according to claim 2, wherein
the magnetic tunnel junction element has a high resistance state and a low resistance state, and
the current limiter is configured to limit a current flowing through the magnetic tunnel junction element when the magnetic tunnel junction element is in the low resistance state.

10. The device according to claim 3, wherein
the magnetic tunnel junction element has a high resistance state and a low resistance state, and
the current limiter is configured to limit a current flowing through the magnetic tunnel junction element when the magnetic tunnel junction element is in the low resistance state.

11. The device according to claim 5, wherein
the magnetic tunnel junction element has a high resistance state and a low resistance state, and
the current limiter is configured to limit a current flowing through the magnetic tunnel junction element when the magnetic tunnel junction element is in the low resistance state.

12. The device according to claim 1, wherein the current limiter is configured to limit a current flowing through the magnetic tunnel junction element, when the magnetic tunnel junction element is connected to a drain side of the cell transistor or to a high voltage side of the cell transistor.

13. The device according to claim 2, wherein the current limiter is configured to limit a current flowing through the magnetic tunnel junction element, when the magnetic tunnel junction element is connected to a drain side of the cell transistor or to a high voltage side of the cell transistor.

14. The device according to claim 3, wherein the current limiter is configured to limit a current flowing through the magnetic tunnel junction element, when the magnetic tunnel junction element is connected to a drain side of the cell transistor or to a high voltage side of the cell transistor.

15. The device according to claim 5, wherein the current limiter is configured to limit a current flowing through the magnetic tunnel junction element, when the magnetic tunnel junction element is connected to a drain side of the cell transistor or to a high voltage side of the cell transistor.

16. The device according to claim 8, wherein the current limiter is configured to limit a current flowing through the magnetic tunnel junction element, when the magnetic tunnel junction element is connected to a drain side of the cell transistor or to a high voltage side of the cell transistor.

17. The device according to claim 1, wherein the current limiter comprises a constant-current source which is configured to supply a first current to the magnetic tunnel junction element and the cell transistor upon data rewriting.

18. The device according to claim 1, wherein the current limiter comprises a current mirror circuit configured to allow a first current to flow through the magnetic tunnel junction element, the first current being substantially equal to a current flowing through a resistance element having a first resistance value.

19. The device according to claim 2, further comprising a switching element connected between a power supply and the first and second bit lines, wherein
the current limiter is configured to allow a first current substantially equal to a current flowing through a resistance element to flow through the magnetic tunnel junction element, and to control a conducting state of the switching element via a voltage across the resistance element having a first resistance value.

* * * * *